(12) United States Patent
Kim et al.

(10) Patent No.: US 12,080,330 B2
(45) Date of Patent: Sep. 3, 2024

(54) MEMORY ARRAY WITH COMPENSATED WORD LINE ACCESS DELAY

(71) Applicant: Micron Technology, Inc., Boise, ID (US)

(72) Inventors: Si Hong Kim, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 17/899,859

(22) Filed: Aug. 31, 2022

(65) Prior Publication Data

US 2024/0071456 A1    Feb. 29, 2024

(51) Int. Cl.
G11C 11/22         (2006.01)

(52) U.S. Cl.
CPC ........ G11C 11/2273 (2013.01); G11C 11/221 (2013.01); G11C 11/2257 (2013.01)

(58) Field of Classification Search
CPC .............. G11C 11/2273; G11C 11/221; G11C 11/2257; G11C 11/2259
See application file for complete search history.

(56) References Cited

U.S. PATENT DOCUMENTS

| | | | | |
|---|---|---|---|---|
| 4,621,260 A * | 11/1986 | Suzuki | ................. | G09G 3/3648 345/206 |
| 11,244,715 B1 | 2/2022 | Vimercati | | |
| 2005/0254282 A1 * | 11/2005 | Summerfelt | ........... | G11C 5/147 365/145 |
| 2013/0051114 A1 * | 2/2013 | Kim | ......................... | G11C 7/08 365/158 |
| 2020/0185019 A1 * | 6/2020 | Vimercati | ........... | G11C 11/2273 |
| 2022/0101917 A1 * | 3/2022 | Bedeschi | ............... | G11C 7/065 |
| 2022/0172764 A1 | 6/2022 | Vimercati | | |
| 2023/0386545 A1 * | 11/2023 | Liu | ....................... | G11C 11/221 |

OTHER PUBLICATIONS

U.S. Appl. No. 17/899,849, filed Aug. 31, 2022, Si Hong Kim et al.
U.S. Appl. No. 17/383,090, filed Jul. 22, 2021, Makoto Kitagawa.
U.S. Appl. No. 17/556,619, filed Dec. 20, 2021, Kwang-Ho Cho.
U.S. Appl. No. 17/749,401, filed May 20, 2022, Makoto Kitagawa.

* cited by examiner

*Primary Examiner* — Khamdan N. Alrobaie
(74) *Attorney, Agent, or Firm* — Fletcher Yoder, P.C.

(57) ABSTRACT

Systems and method for sensing an accessed voltage value associated with a memory cell is described. In different embodiments, a memory array may include a different number of sense amplifiers. Moreover, each sense amplifier may include capacitors with different capacitance values to compensate for a difference in received charges associated with a similar memory state caused by various circuit delays. For example, farther memory cells from a word line driver may receive activation signals with higher delays which in turn may result in delayed activation. As such, the sense amplifiers may include capacitors with varying capacitance values to compensate for an amount charge received at a latching time caused by delayed provision of charges associated with the targeted memory states.

20 Claims, 4 Drawing Sheets

MEMORY ARRAY WITH COMPENSATED WORD LINE ACCESS DELAY

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory arrays and more specifically to providing memory commands for accessing, sensing, and other operations for memory cells. Memory devices are widely used to store information in various electronic devices such as computers, wireless communication devices, cameras, digital displays, and the like. Information is stored by programming different states of storage elements of a memory device. For example, binary devices have two states, often denoted by a logic "1" or a logic "0." In other systems, more than two states may be stored in each storage element. To access the stored information, the electronic device may read or sense the stored state in the storage element of the memory device. To store information, the electronic device may write or program the state in the storage element of the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. A non-volatile memory device, e.g., a flash memory, can store data for extended periods of time even in the absence of an external power source. A volatile memory device, e.g., a DRAM, may lose the stored state over time unless it is periodically refreshed by an external power source.

A memory device may include a number of memory arrays each including multiple storage elements, such as memory cells. Memory cells of a binary memory device may, for example, include a charged or discharged capacitor. A charged capacitor of a memory cell may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous in certain applications. Some of the memory devices include memory cells that may be accessed by turning on a transistor that couples the memory cell (e.g., the capacitor) with a word line or a bit line/digit line.

For example, FeRAMs may use similar device architectures as a volatile memory but may have non-volatile properties due to the use of a ferroelectric capacitor as a storage element or memory cell. FeRAM devices may thus have improved performance compared to some other non-volatile and volatile memory devices. Moreover, some FeRAMs may split a sense window of a FeRAM memory cell to store 2 states per memory cell, whereas, other FeRAMs may split a sense window of a FeRAM memory cell to store multiple states (e.g., 3 or 4) per memory cell.

Moreover, different memory arrays may use different architectures for arranging the memory cells. For example, different memory arrays may arrange the memory cells in 2-dimensional or 3-dimensional rows and columns. A memory cell may be accessed (e.g., latched) based on activating a row and a column of the memory device corresponding to the memory cell. However, in some cases, latched data bits corresponding to a similar data bit value that are received from different memory cells along a word line may have different voltage values.

BRIEF DESCRIPTION OF THE DRAWINGS

Various aspects of this disclosure may be better understood upon reading the following detailed description and upon reference to the drawings in which.

DETAILED DESCRIPTION

Figure 1:
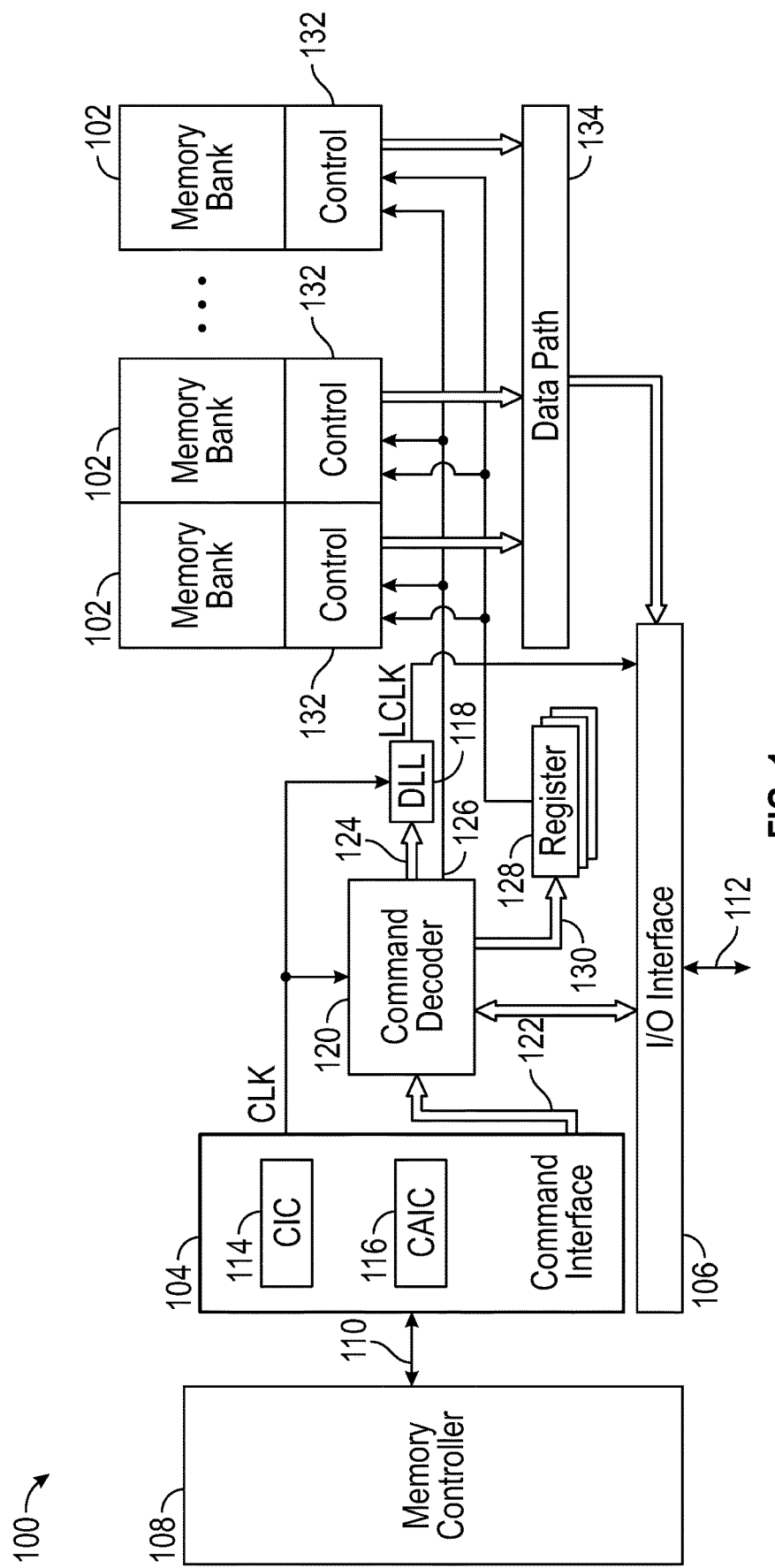
FIG. 1 is a block diagram illustrating certain features of a memory device, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The current disclosure is directed to systems and methods for compensating for a timing difference (e.g., delay) associated with receiving an applied voltage at different positions along a word line of a memory array. For example, an electronic device may include a memory device among other things. The memory device may include a memory array including multiple memory cells. Each memory cell may store electrical charges indicative of one or more data bits. Moreover, the memory cells may be disposed between a number of word lines and digit lines of the memory array such that each memory cell is coupled to a respective word line and a respective digit line. The memory array may also include one or more word line drivers and multiple sense amplifiers. For example, each word line driver may be coupled to a number of the word lines and each sense amplifier may be coupled to a number of the digit lines.

A word line driver may apply a voltage to a word line coupled to a target memory cell to read a data bit stored on the target memory cell. The target memory cell may provide electrical charges corresponding to the stored data bit to a digit line coupled thereto in response to receiving the applied voltage. Accordingly, a sense amplifier coupled to the digit line may latch a voltage present on the digit line (e.g., a digit line voltage) indicative of the stored data bit on the target memory cell.

In different embodiments, the sense amplifier may include different circuitry to latch the digit line voltage. For example, the sense amplifier may include one or more reference capacitors and latching circuitry. The reference capacitors may condition the digit line voltage for latching. For example, the reference capacitors may pull the digit line voltage down (e.g., subtract electrical charges) to provide a conditioned digit line voltage to the latching circuitry. Moreover, the latching circuitry may latch the conditioned digit line voltage. For example, the latching circuitry may compare the conditioned digit line voltage with an input voltage to latch a data bit value (e.g., memory state) associated with the conditioned digit line voltage (or pulled down digit line voltage). The sense amplifier may provide the latched data bit (or the latched conditioned digit line voltage) to a processor and/or controller associated with the memory device.

With the foregoing in mind, different memory cells of a word line may receive a voltage applied by a word line decoder with different delays. In particular, the memory cells of the word line may receive the applied voltage with different delays based on the position of the respective memory cells on the word line. In some cases, each word line of the memory array may have inherent resistance, parasitic capacitance, and/or parasitic inductance. As such, a target memory cell may receive an applied voltage of a word line decoder with a delay caused by the inherent resistance, the parasitic capacitance, and/or the parasitic inductance present on the word line. For example, a delay for receiving the applied voltage may increase along the word line as the inherent resistance, the parasitic capacitance, and/or the parasitic inductance may cumulatively increase. Accordingly, farther memory cells from the word line decoder may receive the applied voltage from the word line decoder with higher delays.

If not compensated for, latched data bits corresponding to a similar data bit value (e.g., 0, 1, among other values) that are received from different memory cells along a word line may have different (e.g., skewed) voltage values. As mentioned above, memory cells that are positioned farther from a word line decoder along a word line may receive an applied voltage of the word line decoder at a later time (e.g., with a higher delay). As such, farther memory cells of the word line from the word line decoder may provide a digit line voltage corresponding to a stored data bit with a higher delay based on receiving the applied voltage at the later time. Accordingly, at a similar latching time, the sense amplifiers coupled to the farther memory cells may latch a lower voltage value for a similar data bit value based on the higher delay.

In some embodiments, different sense amplifiers may include reference capacitors with different capacitance values to compensate for the delay associated with receiving the applied voltage along a word line. For example, the sense amplifiers coupled to the memory cells that are positioned farther from a word line decoder along a word line may include reference capacitors with a lower capacitance value. As such, the sense amplifiers coupled to the farther memory cells may pull the digit line voltage down less than the sense amplifiers that are coupled to the memory cells closer to the word line driver. Accordingly, at the similar latching time, the sense amplifiers coupled to the farther memory cells may latch a similar voltage for a similar data bit value compared to the memory cells near the word line driver. Moreover, in some cases, the memory array may include multiple word line drivers coupled to different sides of the word lines. In such cases, one or more of the sense amplifiers may include multiple reference capacitors that are selectable to pull down the digit line voltage based on the word line driver applying the voltage.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such memory devices may include a corresponding logic storing device (e.g., a capacitor, a resistor, or the resistance of the chalcogenide material (s)).

The memory device 100 may include a number of memory banks 102 each inclusive of one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle. Furthermore, the memory banks 102 may be grouped into multiple memory groups (e.g., two memory groups, three memory groups).

The memory device 100 may also include a command interface 104 and an input/output (I/O) interface 106. The command interface 104 is configured to provide a number of signals received from a processor (e.g., a processor subsystem of an apparatus) or a controller, such as a memory controller 108. In different embodiments, the memory controller 108, hereinafter controller 108, may include one or more processors (e.g., memory processors), one or more programmable logic fabrics, or any other suitable processing components.

In some embodiments, a bus 110 may provide a signal path or a group of signal paths to allow bidirectional communication between the controller 108, the command interface 104 and the I/O interface 106. For example, the controller 108 may receive memory access requests from the I/O interface via the command interface 104 and the bus 110. Moreover, the controller 108 may provide the access commands and/or access instructions for performing memory operations to the command interface 104 via the bus 110.

Similarly, an external bus 112 may provide another signal path or group of signal paths to allow for bidirectional transmission of signals, such as data signals and access commands (e.g., read/write requests), between the I/O interface 106, the controller 108, a command decoder 120, and/or other components. Thus, the controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the controller 108. For example, a reset command may be used to reset the command interface 104, status registers, state machines and the like, during power-up. Various testing signals may also be provided to the memory device 100. For example, the controller 108 may use such testing signals to test connectivity of different components of the memory device 100. In some embodiments, the command interface 104 may also provide an alert signal to the controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 112.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 112. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK.

Accordingly, the command decoder 120 may decode the access commands (e.g., memory access requests) to provide the access instructions. In some cases, the command decoder 120 may receive the access commands using a rising edge and/or a falling edge of the external clock signal. For example, a processor may transmit the access commands using a memory command protocol such as the multi-clock cycle memory command protocol. Moreover, the processor may use a specific memory command protocol based at least in part on the number of pins of the memory device 100 or the I/O interface 106, the number of rows and/or columns of the memory banks 102, and the number of memory banks 102. Subsequently, the command decoder 120 may provide the access instructions to the memory banks 102 based on receiving and decoding the access commands.

Accordingly, the command decoder 120 may provide the access instructions to the memory banks 102 using one or multiple clock cycles of the CLK via the bus path 126. The command decoder 120 may also transmit various signals to one or more registers 128 via, for example, one or more global wiring lines 130. Moreover, the memory device 100 may include other decoders, such as row decoders and column decoders, to facilitate access to the memory banks 102, as discussed below.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory arrays of the respective memory banks 102. For example, the control blocks 132 may include circuitry (e.g., logic circuitry) to facilitate accessing the memory cells of one or more memory arrays of the respective memory banks 102 based on receiving the access instructions.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various semiconductor devices to provide and/or define operations of various components of the memory device 100.

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the semiconductor device (e.g., die), such that the registers are communicatively coupled to the corresponding memory components.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over the data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
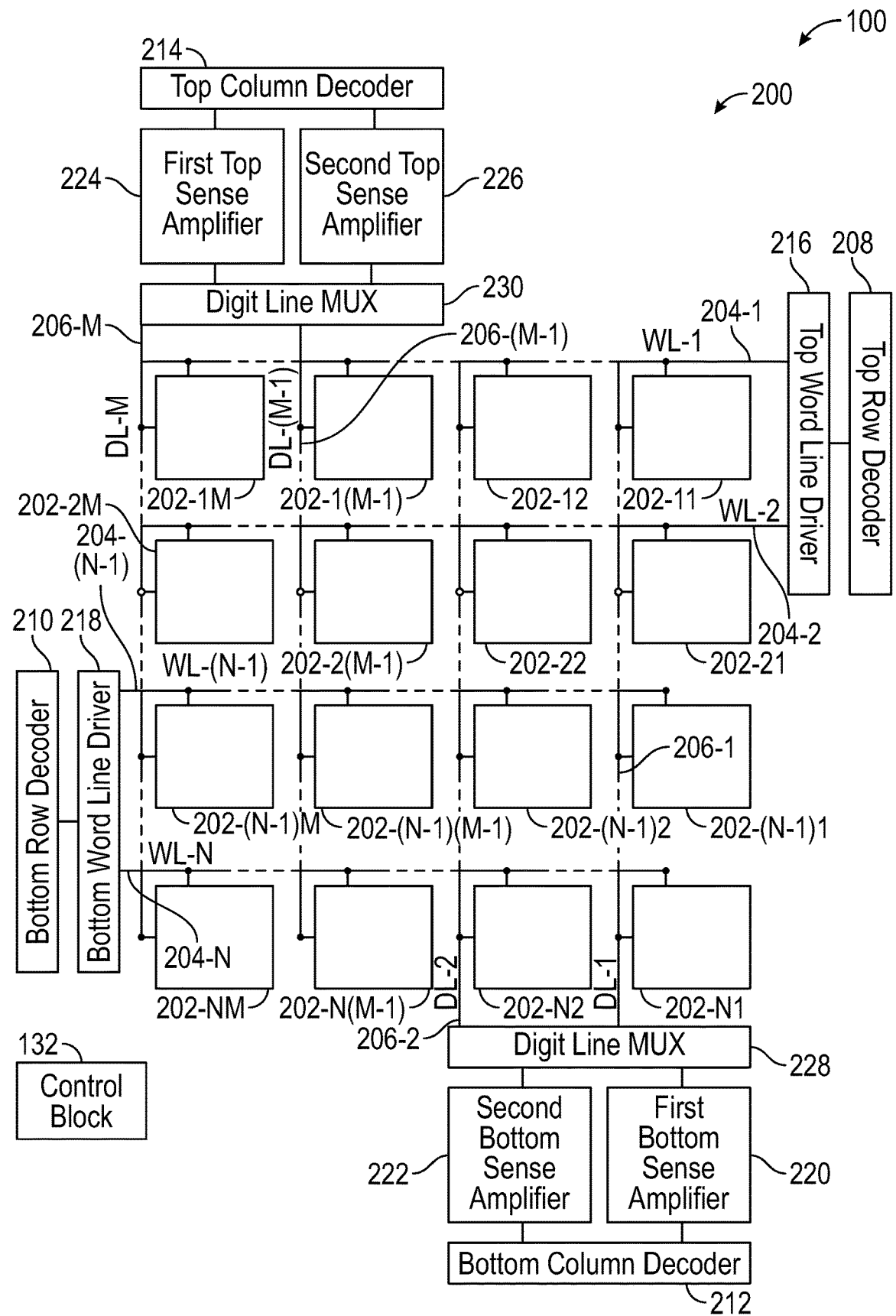
FIG. 2 is a memory array including compensation circuitry for a timing difference (e.g., delay) associated with receiving an applied voltage at different positions along a word line of the memory array is illustrated, in accordance with an embodiment of the present disclosure.

Referring now to FIG. 2, a memory array 200 including compensation circuitry for a timing difference (e.g., delay) associated with receiving an applied voltage at different positions along a word line of the memory array 200 is illustrated in accordance with various examples of the present disclosure. The memory banks 102 of the memory device 100 discussed above may include the memory array 200. The memory array 200 may include a number of memory cells 202 (e.g., memory cells 202-11 through 202-NM) that are programmable to store different memory states. In the depicted embodiment, the memory cells 202 may be arranged in multiple rows and multiple columns. For example, the memory array 200 may include multiple word lines 204, labeled WL-1 through WL-N, and multiple digit lines 206, labeled DL-1 through DL-M, where N and M depend on the array size.

Memory operations, such as reading and writing memory states, may be performed on the memory cells 202 by activating or selecting the appropriate word lines 204-1 through 204-N (WL-1 through WL-N) and digit lines 206-1 through 206-M (DL-1 through DL-M). In some cases, the memory cells 202 may include a capacitor that has a dielectric material to store a charge representative of the programmable states. For example, the capacitor may include a ferroelectric material as the dielectric material to store the charge. In any case, activating or selecting a word line 204 or a digit line 206 may include applying a voltage to the respective lines. The word lines 204 and the digit lines 206 may include conductive materials. In some embodiments, the word lines 204 and digit lines 206 may be made of metals (such as copper, aluminum, gold, tungsten, etc.), metal alloys, other conductive materials, or the like.

Inherent and/or parasitic impedances associated with a word line 204 may delay providing the applied voltage on a word line 204 to a target memory cell 202. For example, the word lines 204 may provide an applied voltage to a target memory cell 202 with a delay based on characteristics of the metal, an architecture of the memory array 200, a position of the target memory cell 202 on the word line, among other possibilities. In some cases, if not compensated for, such delays may cause erroneous memory operations.

In the depicted embodiment, each row of the memory cells 202 is connected to a single word line 204, and each column of the memory cells 202 is connected to a single digit line 206. Moreover, each of the memory cells 202 may be associated with a row and a column of the memory array 200. Accordingly, each of the memory cells 202 is connected to a respective word line 204 and a respective digit line 206.

In some cases, by applying a voltage to a single word line 204 and a single digit line 206, a single memory cell 202 may be activated (or accessed) at their intersection. Accessing a target memory cell 202 may include performing reading or writing operations on the memory cell 202. For example, a read operation may include sensing a charge level stored on the target memory cell 202. The intersection of a word line 204 and digit line 206 may be referred to as an address of a respective memory cell 202. Accordingly, the controller 108 (and/or the command decoder 120) may provide the access instructions, including address bits, to indicate the word lines 204 and digit lines 206 corresponding to the target memory cells 202.

In some architectures, the memory state storage of the memory cells 202 (e.g., a capacitor) may be electrically isolated from the respective digit lines 206 by a selection component. The respective word lines 204 may be connected to and may control the selection components. In some cases, a selection component may include a transistor and the respective word line 204 may be connected to a gate of the transistor. For example, activating the word line 204-1 may result in an electrical connection or closed circuit between the capacitor of the memory cells 202-11, 202-12, 202-1(M−1), and 202-1M and the respective digit lines 206-1, 206-2, 206-(M−1), and 206-M. Moreover, the digit line 206-1 may then be activated to either read or write the memory cell 202-11. In another example, by activating a word line 204-2 and a digit line 206-2, e.g., WL-2 and DL-2, the memory cell 202-22 at their intersection may be accessed by the digit line 206-2.

In the depicted embodiment, accessing the memory cells 202 may be controlled through a top row decoder 208, a bottom row decoder 210, a bottom column decoder 212, and/or a top column decoder 214. In different embodiments, the controller 108, the command decoder 120, and/or the control blocks 132 may include the top row decoder 208, the bottom row decoder 210, the bottom column decoder 212, and/or the top column decoder 214. In some cases, the top row decoder 208 and/or the bottom row decoder 210 may provide an indication to activate a word line 204 based on receiving and decoding the access commands and/or the access instructions. Moreover, the bottom column decoder 212 and/or the top column decoder 214 may provide an indication to activate a digit line 206 based on the access commands and/or the access instructions. Accordingly, the memory array may read from or write to a target memory cell 202 at the intersections of the respective word line 204 and digit line 206.

In the depicted embodiment, the top row decoder 208 may be coupled to the word lines 204-1 and 204-2 through a top word line driver 216. In some cases, the top row decoder 208 may receive a row address from the controller 108 (and/or the command decoder 120) to activate the word line 204-1 or 204-2 associated with a target memory cell 202. The top row decoder 208 may provide the indication (e.g., one or more control signals) to activate the word line 204-1 or 204-2 to the top word line driver 216 based on the received row address. For example, the top word line driver 216 may apply a voltage to activate the word line 204-1 or 204-2 in response to receiving the indications. Accordingly, the target memory cell 202 may provide (e.g., induce) a digit line voltage corresponding to a stored data bit based on receiving the applied voltage on the respective word line 204-1 or 204-2.

Moreover, the bottom row decoder 210 may be coupled to the word lines 204-(N−1) and 204-N through a bottom word line driver 218. In some cases, the bottom row decoder 210 may receive a row address from the controller 108 (and/or the command decoder 120) to activate the word line 204-(N−1) or 204-N associated with a target memory cell 202. The bottom row decoder 210 may provide the indication (e.g., one or more control signals) to activate the word line 204-(N−1) or 204-N to the bottom word line driver 218 based on the received row address. The bottom word line driver 218 may apply a voltage to activate the word lines 204-(N−1) or 204-N in response to receiving the indications. The target memory cell 202 may provide a digit line voltage corresponding to a stored data bit based on receiving the applied voltage on the respective word line 204-(N−1) or 204-N.

In some cases, the top row decoder 208 may include the top word line driver 216 and/or the bottom row decoder 210 may include the bottom word line driver 218. Moreover, in some cases, the top word line driver 216 and/or the bottom word line driver 218 may include amplification circuitry to apply the voltage. Furthermore, it should be appreciated that in alternative or additional embodiments, the top row decoder 208, the top word line driver 216, the bottom row decoder 210, and the bottom word line driver 218 may each be coupled to a different number of word lines 204.

In any case, the bottom column decoder 212 may be coupled to the digit lines 206-1 and 206-2 via a first bottom sense amplifier 220 and a second bottom sense amplifier 222, respectively. Moreover, the top column decoder 214 may be coupled to the digit lines 206-M and 206-(M−1) via a first top sense amplifier 224 and a second top sense amplifier 226, respectively. Although in the depicted embodiment the sense amplifiers 220, 222, 224, and 226 are each coupled to a respective digit line 206-1, 206-2, 206-3, and 206-4, in alternative or additional embodiments, the sense amplifiers 220, 222, 224, and 226 may each be coupled to a different number of digit lines. For example, the sense amplifiers 220, 222, 224, and 226 may each be coupled to 1, 2, 8, 16, 32, 64, 128, and so on, number of the digit lines 206.

For example, in the depicted embodiment, digit line MUX 228 may connect and disconnect (e.g., multiplex) the digit lines 206-1 and 206-2 to the first bottom sense amplifier 220 and the second bottom sense component 222. Moreover, digit line MUX 230 may connect and disconnect (e.g., multiplex) the digit lines 206-(M−1) and 206-M to the first top sense component 224 and the second top sense component 226. In alternative or additional cases, the digit lines 206-1 through 206-M may couple to the sense amplifiers 220, 222, 224, and/or 226 directly or via a different component. In some cases, the digit line MUXs 228 and 230 may couple each sense amplifiers 220, 222, 224, and/or 226 to multiple digit lines 206-1 through 206-M.

Moreover, in alternative or additional embodiments, the memory array 200 may include a different number of (e.g., additional) sense amplifiers. As mentioned above, the memory array 200 may include multiple digit lines 206, labeled DL-1 through DL-M, where M depends on the array size. Furthermore, each sense amplifier of the memory array 200, including the sense amplifiers 220, 222, 224, and 226, may be coupled to a number of the digit lines 206. Accordingly, in alternative or additional embodiments, the memory array 200 may include a different number of sense amplifiers based on the array size and a number of the digit lines 206 coupled to one or more (e.g., each) of the sense amplifiers.

For example, the bottom column decoder 212 and/or the top column decoder 214 may receive a column address from the controller 108 (and/or the command decoder 120) to latch a digit line voltage on one or more of the digit lines 206-1 through 206-M. The bottom column decoder 212 may provide an indication (e.g., one or more control signals) to the first bottom sense amplifier 220 or the second bottom sense amplifier 222 to latch a digit line voltage of the digit lines 206-1 and 206-2, respectively. Similarly, the top column decoder 214 may provide an indication (e.g., one or more control signals) to the first top sense amplifier 224 or the second top amplifier 226 to latch a digit line voltage of the digit lines 206-M and 206-(M−1), respectively.

The sense amplifiers 220, 222, 224, and 226 may each include a first reference capacitor, a second reference capacitor, selection circuitry, and latching circuitry to latch the digit line voltages. Moreover, the sense amplifiers 220, 222, 224, and 226 may each receive a selection signal and a reference voltage. The first reference capacitor and the second reference capacitor may be associated with pulling down a digit line voltage (e.g., subtracting electrical charges, applying a common mode voltage, apply a sensing voltage, etc.) before latching the digit line voltage by the latching circuitry. For example, the latching circuitry of the sense amplifiers 220, 222, 224, and 226 may each include various amplifiers and/or transistors in order to detect and amplify a difference in pulled-down digit line voltages, which may be referred to as latching.

The first reference capacitor of each of the sense amplifiers 220, 222, 224, and 226 may pull the digit line voltage down when the top word line driver 216 is coupled to the target memory cell 202 (e.g., via the word lines 204-1 and 204-2). Moreover, the second reference capacitor of each of the sense amplifiers 220, 222, 224, and 226 may pull the digit line voltage down when the bottom word line driver 218 is coupled to the target memory cell 202 (e.g., via the word lines 204-(N−1) and 204-N). For example, the selection circuitry may select the first reference capacitor or the second reference capacitor based on the selection signal, as will be appreciated.

The selection signal may be indicative of whether the target memory cell 202 is associated with the top word line driver 216 or the bottom word line driver 218. In some embodiments, the selection signal may include the row address, a portion of the row address, and/or one or more control signals determined based on the row address to indicate whether the top word line driver 216 or the bottom word line driver 218 is associated with the target memory cell 202. The controller 108, the command decoder 120, and/or the control blocks 132, among other things, may provide the selection signal to the sense amplifiers 220, 222, 224, and 226 based on the row address.

The selection circuitry of a sense amplifier associated with the target memory cell 202, such as the sense amplifier 220, 222, 224, or 226, may apply the reference voltage to the first reference capacitor or the second reference capacitor based on the selection signal. As such, the first reference capacitor or the second reference capacitor may pull the digit line voltage of the digit line 206 associated with the target memory cell 202 down based on receiving the reference voltage. Moreover, as mentioned above, each memory cell 202 may provide the digit line voltage to a digit line 206 coupled thereto based on receiving the applied voltage on the respective word line 204. Accordingly, latching circuitry of a sense amplifier may latch a digit line voltage of the respective data lines 206-1, 206-2, 206-(M−1), and 206-M.

As mentioned above, different memory cells 202 coupled to each of the word lines 204-1 through 204-N may receive the applied voltages with different delays. In particular, the word lines 204 may provide an applied voltage to a target memory cell 202 with a delay based on a position of the target memory cell 202 on the respective word line 204 with respect to the top words line driver 216 or bottom word line driver 218 coupled thereto. As discussed above, the delay for receiving the applied voltage may increase along the word lines 204 as an inherent resistance, a parasitic capacitance, and/or a parasitic inductance of the word lines 204 may cumulatively increase.

As such, the memory cells 202 that are positioned farther from the word line drivers 216 or 218 may receive the applied voltage from the respective word line decoders 216 or 218 with higher delays. Moreover, the memory cells 202 may provide the digit line voltage based on receiving the applied voltage on the respective word lines 204. Accordingly, in some cases, farther memory cells 202 from the respective word line drivers 216 or 218 may provide the digit line voltage with higher delays when targeted. In such cases, if not compensated for, the sense components 220, 222, 224, and 226 may each latch lower charge amounts associated with a similar data bit value from the memory cells 202 positioned farther to the respective word line drivers 216 or 218 when latched at the same time.

To compensate for the charge amount differences of similar data bit values latched by different memory cells 202 along the word lines 204, the sense amplifiers 220, 222, 224, and 226 may include first reference capacitors with different capacitance values. For example, one or more of the sense amplifiers 220, 222, 224, and 226 may include first reference capacitors with different capacitance values based on a distance (e.g., average distance) between one or more respective memory cells 202 coupled thereto and the top word line driver 216. Moreover, one or more of the sense amplifiers 220, 222, 224, and 226 may include second reference capacitors with different capacitance values based on a distance (e.g., average distance) between one or more respective memory cells 202 coupled thereto and the bottom word line driver 218.

In particular, in some embodiments, the sense amplifiers 220, 222, 224, and 226 coupled to farther memory cells 202 with respect to the top word line driver 216 may include first reference capacitors with a smaller capacitance value. For example, in the depicted embodiment, the first bottom sense amplifier 220 may include a first reference capacitor with a first capacitance value. Moreover, the second bottom sense amplifiers 222 may include a first reference capacitor with a second capacitance value lower than the first capacitance value based on being coupled to respective memory cells 202 positioned farther from the top word line driver 216. Similarly, the second top sense amplifier 226 may include a first reference capacitor with a third capacitance value lower than the first and the second capacitance values. Furthermore, the first top sense amplifier 224 may include a first reference capacitor with a fourth capacitance value lower than the first, the second, and the third capacitance values.

Similarly, in such embodiments, the sense amplifiers 220, 222, 224, and 226 coupled to farther memory cells 202 with respect to the bottom word line driver 218 may include second reference capacitors with a smaller capacitance value. For example, in the depicted embodiment, the first top sense amplifier 224 may include a second reference capacitor with a fifth capacitance value. Moreover, the second top sense amplifiers 226 may include a second reference capacitor with a sixth capacitance value lower than the fifth capacitance value based on being coupled to respective memory cells 202 positioned farther from the bottom word line driver 218. The second bottom sense amplifier 222 may include a second reference capacitor with a seventh capacitance value lower than the fifth and the sixth capacitance values. Furthermore, the first bottom sense amplifier 220 may include a second reference capacitor with an eighth capacitance value lower than the fifth, the sixth, and the seventh capacitance values.

Figure 3:
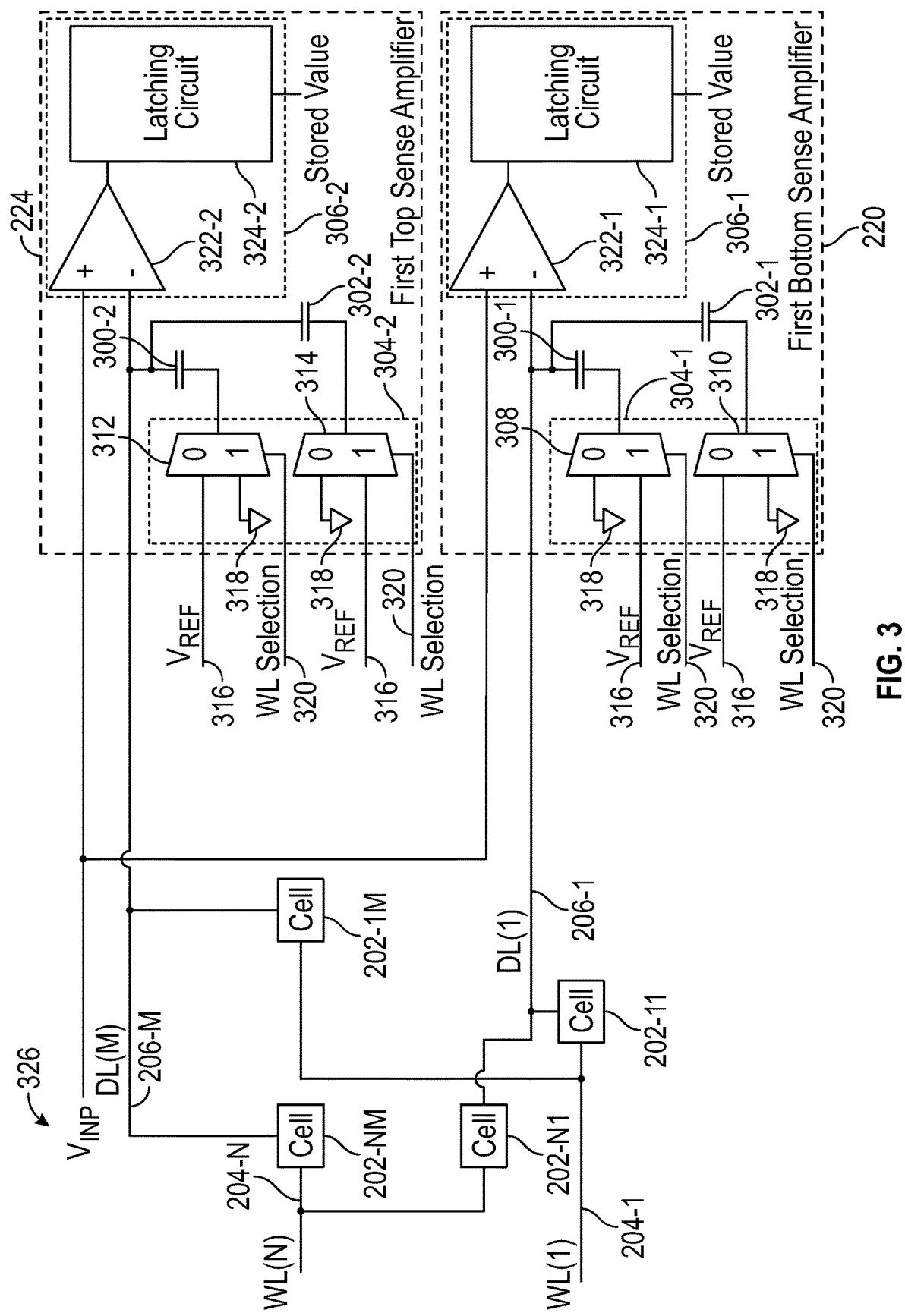
FIG. 3 is a portion of the memory array of FIG. 2, in accordance with an embodiment of the present disclosure.

With the foregoing in mind, FIG. 3 is a portion of the memory array 200 including the memory cells 202-11 and 202-N1 coupled to the first bottom sense amplifier 220 and the memory cells 202-1M and 202-NM coupled to the first top sense amplifier 224. Moreover, the memory cells 202-11 and 202-1M are coupled to the top word line driver 216. Furthermore, the memory cells 202-N1 and 202-NM are coupled to the bottom word line driver 218.

In the depicted embodiment, the first bottom sense amplifier 220 may include a first reference capacitor 300-1 with the first capacitance value mentioned above. For example, the first capacitance value may be determined based at least in part on a delay for receiving a voltage applied by the top word line driver 216. In the depicted embodiment, the top word line driver 216 may apply the voltage to access/activate the memory cell 202-11. Moreover, the first top sense amplifier 224 may include a first reference capacitor 300-2 with the fourth capacitance value lower than the first capacitance value. Similarly, the fourth capacitance value may be determined based at least in part on a delay for receiving a voltage applied by the top word line driver 216. For example, the top word line driver 216 may apply the voltage to access/activate the memory cell 202-1M positioned farther than the memory cell 202-11 from the top word line driver 216.

Moreover, the first top sense amplifier 224 may include a second reference capacitor 302-2 with the fifth capacitance value discussed above. For example, the fifth capacitance value may be determined based at least in part on a delay for receiving a voltage applied by the bottom word line driver 218. In the depicted embodiment, the bottom word line driver 218 may apply the voltage to access/activate the memory cell 202-NM. Furthermore, the first bottom sense amplifier 220 may include a second reference capacitor 302-1 with the eighth capacitance value lower than the fifth capacitance value. Similarly, the eighth capacitance value may be determined based at least in part on a delay for receiving a voltage applied by the bottom word line driver 218. For example, the bottom word line driver 218 may apply the voltage to access/activate the memory cell 202-N1 positioned farther than the memory cell 202-NM from the bottom word line driver 218.

The first bottom sense amplifier 220 may include selection circuitry 304-1 and latching circuitry 306-1. Moreover, the latching circuitry 306-1 may include an amplifier 322-1 and a latching circuit 324-1. Moreover, the first top sense amplifier 224 may include selection circuitry 304-2 and latching circuitry 306-2. In the depicted embodiment, the selection circuitry 304-1 may include a first multiplexer (MUX) 308 and second MUX 310 and the selection circuitry 304-2 may include a first MUX 312 and second MUX 314. It should be appreciate that in some embodiments the MUXs 302 and 322 may be positioned outside the sense amplifiers 220 and 224. For example, in such embodiments, each MUX 308, 310, 312, and/or 314 may be shared by the sense amplifiers 220, 222, 224, and/or 226, among other circuitry.

The first MUX 308 may include a first input terminal coupled to a ground connection 318 and a second input terminal coupled to a reference voltage 316, labeled as $V_{REF}$. Moreover, the second MUX 310 may include a first input terminal coupled to the reference voltage 316 and a second input terminal coupled to the ground connection 318. Furthermore, the first MUX 308 and the second MUX 310 may receive a selection signal 320, labeled as WL SELECTION. As discussed above, the selection signal 320 may be indicative of whether a target memory cell 202 is associated with the top word line driver 216 or the bottom word line driver 218.

In the depicted embodiment, the first MUX 308 of the first bottom sense amplifier 220 may apply the reference voltage 316 to the first reference capacitor 300-1 when the memory cell 202-11 is targeted based on receiving the selection signal 320. Moreover, the second MUX 310 may apply the reference voltage 316 to the second reference capacitor 302-1 when the memory cell 202-N1 is targeted based on receiving the selection signal 320. Similarly, the first MUX 312 of the first top sense amplifier 224 may apply the reference voltage 316 to the first reference capacitor 300-2 when the memory cell 202-1M is targeted based on receiving the selection signal 320. Moreover, the second MUX 314 may apply the reference voltage 316 to the second reference capacitor 302-2 when the memory cell 202-NM is targeted based on receiving the selection signal 320.

Accordingly, the sensing circuitry 304-1 and 304-2 may compensate for sensing voltage differences caused by different delays for receiving the applied voltages by the memory cells 202. In particular, the sensing circuitry 304-1 and 304-2 may each pull a voltage of the respective digit lines 206-1 and 206-M down by different voltage values to compensate for the differences in the received digit line voltages.

The latching circuitry 306-1 may include an amplifier 322-1 and a latching circuit 324-1. Moreover, the latching circuitry 306-2 may include an amplifier 322-2 and a latching circuit 324-2. The amplifier 322-1, the amplifier 322-2, the latching circuit 324-1, and the latching circuit 324-2 may each include various circuit components such as transistors. The amplifiers 322-1 and 322-2 may receive an input voltage 326, labeled as VINP. For example, the amplifiers 322-1 and 322-2 may amplify a difference between the input voltage 326 and the digit line voltages of the digit lines 206-1 and 206-M, respectively. Accordingly, the latching circuits 324-1 and 324-2 may latch the digit line voltages (e.g., amplified digit line voltages) of the digit lines 206-1 and 206-M, respectively.

Figure 4:
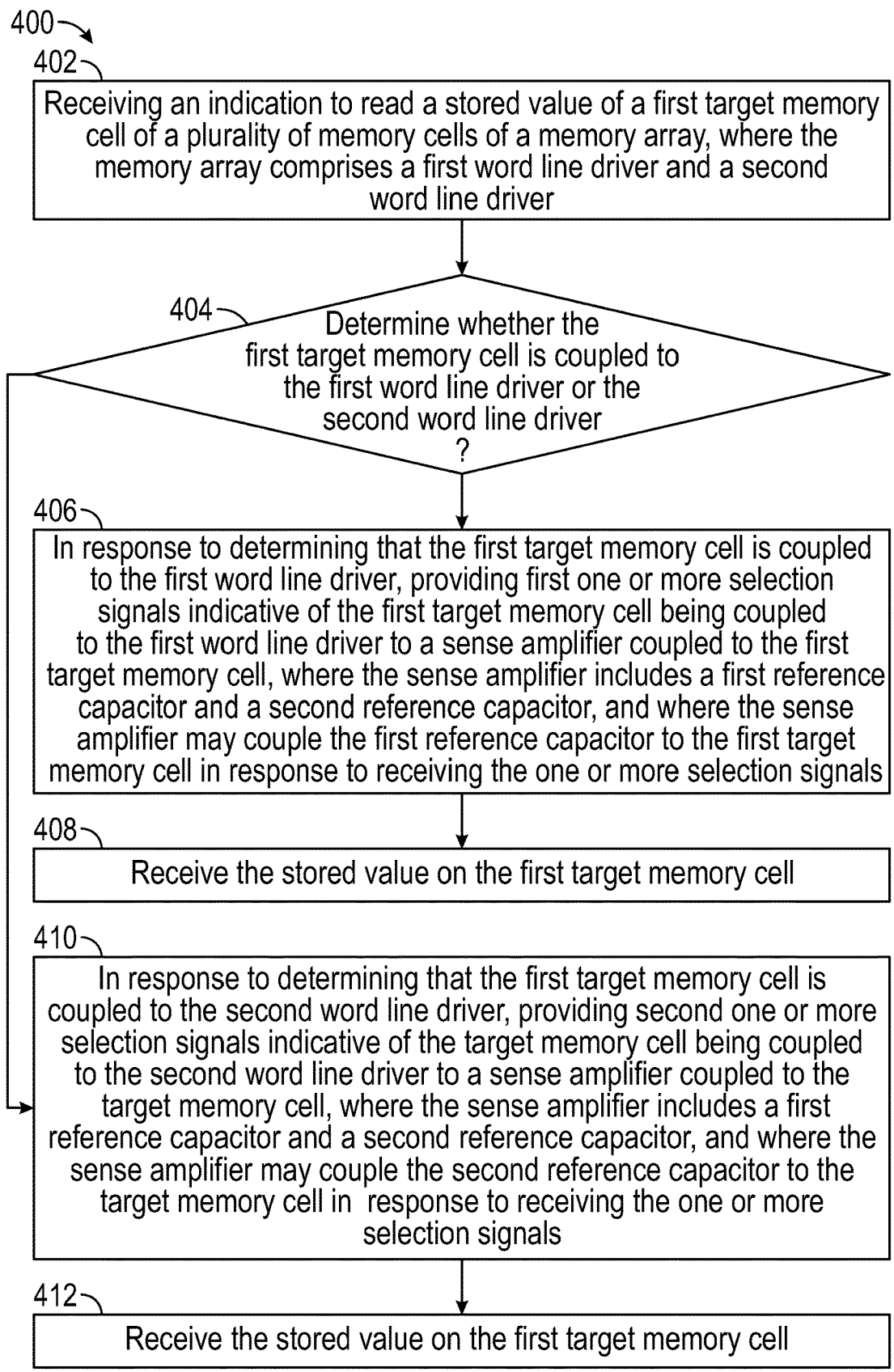
FIG. 4 is a process for latching a voltage of a targeted memory cell of the memory array of FIG. 2 using a first reference capacitor and a second reference capacitor of switching circuitry of FIG. 3, in accordance with an embodiment of the present disclosure.

FIG. 4 depicts a process 400 for latching a voltage of a targeted memory cell 202 using a first reference capacitor 300 and a second reference capacitor 302 of the switching circuitry 304 of the sense amplifiers 220, 222, 224, and/or 226. The process 400 may be performed by the controller 108, or any other viable processing circuitry associated with the memory device 100. Moreover, although the process blocks are described in a particular order, in some embodiments, the process blocks may be performed in a different order, additional processes may be performed, and/or one or more of the process blocks may be omitted.

At block 402, the controller 108 may receive an indication to read a stored value of the target memory cell 202 of the memory array 200. The memory array 200 may include the top word line driver 216 and the bottom word line driver 218.

At block 404, the controller 108 may determine whether the target memory cell 202 is coupled to a first word line driver (e.g., the top word line driver 216) or a (e.g., the second word line driver 218). For example, the target memory cell 202 may be the memory cells 202-11, 202-12, 202-1(M−1), 202-1M, 202-21, 202-22, 202-2(M−1), or 202-2M when coupled to the first word line driver.

At block 406, the controller 108 may provide first one or more selection signals (e.g., the selection signal 320) indicative of the target memory cell 202 being coupled to the first word line driver in response to determining that the first target memory cell 202 is coupled to the first word line driver. The controller 108 may provide the first one or more selection signals to a sense amplifier (e.g., the sense amplifiers 220, 222, 224, or 226) coupled to the target memory cell 202. The sense amplifier may include the first reference capacitor 300 and the second reference capacitor 302. For example, the sense amplifier may couple the first reference capacitor 300 to the target memory cell 202 in response to receiving the selection signals. Moreover, at block 408, the controller 108 may receive the stored value on the target memory cell 202.

Alternatively or additionally, at block 410, the controller 108 may provide second one or more selection signals (e.g., the selection signal 320) indicative of the target memory cell 202 being coupled to the second word line driver in response to determining that the first target memory cell 202 is coupled to the second word line driver. The controller 108 may provide the second one or more selection signals to a sense amplifier (e.g., the sense amplifiers 220, 222, 224, or 226) coupled to the target memory cell 202. Similarly, the sense amplifier may include the first reference capacitor 300 and the second reference capacitor 302. For example, the sense amplifier may couple the first reference capacitor 300 to the target memory cell 202 in response to receiving the selection signals. Moreover, at block 412, the controller 108 may receive the stored value on the target memory cell 202.

With these technical effects in mind, latching an accessed stored value of a memory cell with capacitors having different capacitance values based on a position of the memory cell with respect to a respective word line driver may reduce a probability or occurrence of memory operation failures. In some embodiments, such latching methods and circuitry may reduce the occurrence of false memory read values by the sensing circuitry by improving/increasing a sensing window provided by each embodiment described above. In one non-limiting example, the embodiment FIG. 3 may increase a margin of sensing window for accessing at least some of the memory cells 202 by 75 millivolts (mV) resulting in an increase in sensing window from 125 mV to 200.

Moreover, in some cases, a controller may be used on the host-side of a memory-host interface; for example, a processor, microcontroller, field programmable gate array (FPGA), application-specific integrated circuit (ASIC), or the like may each include a memory controller to facilitate performing such operations. Furthermore, a communication network may enable data communication there between and, thus, a client device to utilize hardware resources accessible through the controller. Based at least in part on user input to the client device, processing circuitry associated with the memory device may perform one or more operations to transmit one or more memory access requests for accessing memory cells arranged in multiple rows of data banks of a memory array. Moreover, the controller may provide the commands using a number of clock cycles based on the number of rows of the memory banks and a number of communication pins of the memory banks to facilitate efficient response to the one or more memory access requests.

Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, controller operations, and memory operations may manifest as improvements in visualization quality (e.g., speed of rendering, quality of rendering), improvements in processing operations, improvements in calculations, or the like based on a reduced error rate.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
   a first word line;
   a second word line;
   a first digit line;
   a plurality of memory cells, wherein a first memory cell of the plurality of memory cells is coupled to the first word line and the first digit line, and a second memory cell of the plurality of memory cells is coupled to the second word line and the first digit line; and
   a first sense amplifier coupled to the first digit line, the first sense amplifier comprising:
      a first reference capacitor coupled to the first digit line;
      a second reference capacitor coupled to the first digit line;
      switching circuitry coupled to the first reference capacitor and the second reference capacitor, the switching circuitry configured to:
         receive a reference voltage;
         provide the reference voltage to the first reference capacitor when the first memory cell is activated; and
         provide the reference voltage to the second reference capacitor when the second memory cell is activated; and
      first latching circuitry coupled to the first digit line.

2. The memory device of claim 1, comprising:
   a first word line driver coupled to the first word line, wherein the first word line driver is configured to apply a voltage to the first word line to activate the first memory cell, wherein a capacitance value of the first reference capacitor is based on a distance between the first digit line and the first word line driver along the first word line, the second word line, or both; and
   a second word line driver coupled to the second word line, wherein the second word line driver is configured to apply a voltage to the second word line to activate the second memory cell, wherein a capacitance value of the second reference capacitor is based on a distance between the first digit line and the second word line driver along the first word line, the second word line, or both.

3. The memory device of claim 1, comprising:
   a second digit line, wherein a third memory cell of the plurality of memory cells is coupled to the first word line and the second digit line;
   a first word line driver coupled to the first word line, wherein the first word line driver is configured to apply a voltage to the first word line to activate the first memory cell or the third memory cell; and
   a second sense amplifier coupled to the second digit line.

4. The memory device of claim 3, wherein the first memory cell and the second memory cell are configured to provide a digit line voltage indicative of a stored value to the first digit line based on receiving the applied voltage.

5. The memory device of claim 3, wherein the third memory cell is disposed farther from the first word line driver along the first word line compared to the first memory cell.

6. The memory device of claim 5, wherein the third memory cell is configured to receive the voltage applied by the first word line driver with a delay compared to the first memory cell based on the third memory cell being disposed farther from the first word line driver along the first word line compared to the first memory cell.

7. The memory device of claim 5, wherein the third memory cell is configured to provide a digit line voltage indicative of a stored value to the second digit line based on receiving the applied voltage with a delay based on the third memory cell being coupled to the first word line farther from the word line driver along the first word line compared to the first memory cell.

8. The memory device of claim 7, wherein the second sense amplifier is configured to provide a common mode voltage drop to the digit line voltage based on the delay.

9. The memory device of claim 1, wherein the plurality of memory cells comprise one or more ferroelectric capacitors.

10. An electronic device comprising a memory device, the memory device comprising:
    a controller configured to provide a selection signal based on an address of a target memory cell of the memory device;
    a memory array comprising:
       a plurality of memory cells, wherein the plurality of memory cells are disposed between a plurality of word lines and a plurality of digit lines, wherein the plurality of memory cells comprise the target memory cell, and wherein the target memory cell is coupled to a first digit line of the plurality of digit lines;
       a first word line driver coupled to a first portion of the plurality of memory cells;
       a second word line driver coupled to a second portion of the plurality of memory cells; and
       a first sense amplifier coupled to the first digit line of the plurality of digit lines, the first sense amplifier comprising:
          a first reference capacitor coupled to the first digit line;

a second reference capacitor coupled to the first digit line;
switching circuitry configured to provide a reference voltage to the first reference capacitor or the second reference capacitor based on the selection signal; and
latching circuitry configured to latch a voltage on the first digit line.

11. The electronic device of claim 10, wherein the selection signal is a row address of the target memory cell, a portion of the row address, one or more control signals associated with the row address, or a combination thereof.

12. The electronic device of claim 10, wherein the switching circuitry is configured to provide the reference voltage to the first reference capacitor when the first word line driver is coupled to the target memory cell and provide the reference voltage to the second reference capacitor when the second word line driver is coupled to the target memory cell.

13. The electronic device of claim 10, wherein the memory array comprises a plurality of sense amplifiers comprising the first sense amplifier, each sense amplifier of the plurality of sense amplifiers coupled to at least one digit line of the plurality of digit lines, and a subplurality of the plurality of the sense amplifiers comprise a respective first reference capacitor and a second reference capacitor.

14. The electronic device of claim 10, wherein the latching circuitry is configured to provide the latched voltage to read a stored value on the target memory cell.

15. The electronic device of claim 10, wherein a capacitance value of the first reference capacitor is based on a delay for receiving a signal from the first word line driver by the first digit line, and wherein a capacitance value of the second reference capacitor is based on a delay for receiving a signal from the second word line driver by the first digit line.

16. A method comprising:
receiving, by a controller of a memory device, an indication to read a stored value of a first target memory cell of a plurality of memory cells of a memory array, wherein the memory array comprises a first word line driver and a second word line driver;
determining, by the controller, that the first target memory cell is coupled to the first word line driver;
providing, by the controller, first one or more selection signals indicative of the first target memory cell being coupled to the first word line driver to a sense amplifier coupled to the first target memory cell, wherein the sense amplifier comprises a first reference capacitor and a second reference capacitor, and wherein the sense amplifier is configured to couple the first reference capacitor to the first target memory cell in response to receiving the one or more selection signals; and
receiving, by the controller, the stored value on the first target memory cell in response to providing the one or more selection signals.

17. The method of claim 16, comprising providing, by the controller, one or more address signals indicative of a word line and a digit line of the first target memory cell to a row decoder and column decoder circuitry of the memory array to access the first target memory cell.

18. The method of claim 16, comprising:
determining, by the controller, that a second target memory cell is coupled to a second word line driver, wherein the second target memory cell is coupled to the second amplifier;
providing, by the controller, second one or more selection signals indicative of the target memory cell being coupled to the second word line driver to the sense amplifier coupled to the target memory cell, wherein the sense amplifier is configured to couple the second reference capacitor to the second target memory cell in response to receiving the second one or more selection signals; and
receiving, by the controller, the stored value on the second target memory cell.

19. The method of claim 18, wherein a capacitance value of the first reference capacitor is based on a delay for receiving a signal from the first word line driver by a digit line coupled to the first target memory cell, and wherein a capacitance value of the second reference capacitor is based on a delay for receiving a signal from the second word line driver by the digit line coupled to the second target memory cell.

20. The method of claim 16, wherein the plurality of memory cells comprise one or more ferroelectric capacitors.

* * * * *